US012772714B2

(12) United States Patent
Zeng et al.

(10) Patent No.: US 12,772,714 B2
(45) Date of Patent: Oct. 20, 2026

(54) DISPLAY PANEL WITH NONOPAQUE AUXILIARY STRUCTURES AND DISPLAY DEVICE

(71) Applicant: Shanghai Tianma Micro-Electronics Co., Ltd., Shanghai (CN)

(72) Inventors: Yang Zeng, Shanghai (CN); Chong Qian, Shanghai (CN); Chenhang Sheng, Shanghai (CN); Hua Gong, Shanghai (CN); Shaowei Liu, Shanghai (CN); Lulu Pan, Shanghai (CN); Ye Jin, Shanghai (CN); Xiaoyan Lai, Shanghai (CN)

(73) Assignee: Shanghai Tianma Micro-Electronics Co., Ltd., Shanghai (CN)

( * ) Notice: Subject to any disclaimer, the term of this patent is extended or adjusted under 35 U.S.C. 154(b) by 476 days.

(21) Appl. No.: 18/338,388

(22) Filed: Jun. 21, 2023

(65) Prior Publication Data

US 2023/0337510 A1 Oct. 19, 2023

(30) Foreign Application Priority Data

Mar. 30, 2023 (CN) ......................... 202310335898.7

(51) Int. Cl.

| | |
|---|---|
| ***H10K 59/80*** | (2023.01) |
| ***H10K 59/12*** | (2023.01) |
| ***H10K 59/121*** | (2023.01) |
| ***H10K 59/38*** | (2023.01) |
| ***H10K 59/40*** | (2023.01) |

(52) U.S. Cl.
CPC ......... *H10K 59/8792* (2023.02); *H10K 59/12* (2023.02)

(58) Field of Classification Search
CPC .. H10K 59/8792; H10K 59/12; H10K 59/121; H10K 59/38; H10K 59/40
See application file for complete search history.

(56) References Cited

U.S. PATENT DOCUMENTS

2024/0188366 A1* 6/2024 Wu ...................... H10K 50/844
2024/0373716 A1* 11/2024 Fang ...................... H10K 59/00

FOREIGN PATENT DOCUMENTS

CN 113764602 A 12/2021

OTHER PUBLICATIONS

First Chinese Office Action mailed on Dec. 18, 2025 in Chinese Application No. 202310335898.7; 13 pages.

* cited by examiner

*Primary Examiner* — Joseph L Williams
(74) *Attorney, Agent, or Firm* — CHRISTENSEN O'CONNOR JOHNSON KINDNESS PLLC

(57) ABSTRACT

Provided a display panel and a display device. The display panel has a first display region including a light-transmitting region. The display panel includes a display function layer including light-emitting elements, a color filter layer arranged on a side of the display function layer facing towards a display surface of the display panel, and auxiliary structures that are nonopaque and arranged on the side of the display function layer facing towards the display surface of the display panel. The color filter layer includes color resists corresponding to the light-emitting elements. The auxiliary structure is at least located between adjacent color resists, and overlaps with the light-transmitting region. The display device includes the display panel.

16 Claims, 10 Drawing Sheets

DISPLAY PANEL WITH NONOPAQUE AUXILIARY STRUCTURES AND DISPLAY DEVICE

CROSS-REFERENCE TO RELATED APPLICATIONS

The present application claims priority to Chinese Patent Application No. 202310335898.7, filed on Mar. 30, 2023, the content of which is incorporated herein by reference in its entirety.

TECHNICAL FIELD

The present disclosure relates to the technical field of display, and in particular, to a display panel and a display device.

BACKGROUND

With the continuous development of display technology, “full screen” displays have become a common design of display screens. A “full screen” display refers to a display screen with an ultra-high screen-to-body ratio such as 100% or approximately 100%. In order to make the display screen have a higher screen-to-body ratio, camera under panel (CUP) technology has become a focus of attention for more and more vendors.

CUP technology sets optical devices, such as cameras, on a back of a display region of the display screen, and the region where these cameras and optical sensors are set is referred to as the CUP region.

Accordingly, the CUP region can not only display images, but also transmit lights required by the camera. There is presently a need to improve the display effect of the display screen with a camera under panel.

SUMMARY

Embodiments of the present disclosure provide a display panel and a display device.

One aspect of the present disclosure provides a display panel having a first display region including a light-transmitting region. The display panel includes: a display function layer including light-emitting elements; a color filter layer arranged on a side of the display function layer facing towards a display surface of the display panel and including color resists provided corresponding to the light-emitting elements; and auxiliary structures that are nonopaque and arranged on the side of the display function layer facing towards the display surface of the display panel. Each of the auxiliary structures is at least located between adjacent color resists of the color resists and overlaps with the light-transmitting region.

Another aspect of the present disclosure provides a display device including a display panel having a first display region. The first display region includes a light-transmitting region. The display panel includes: a display function layer including light-emitting elements; a color filter layer arranged on a side of the display function layer facing towards a display surface of the display panel and including color resists provided corresponding to the light-emitting elements; and auxiliary structures that are nonopaque and arranged on the side of the display function layer facing towards the display surface of the display panel. Each of the auxiliary structures is at least located between adjacent color resists of the color resists and overlaps with the light-transmitting region.

DESCRIPTION OF EMBODIMENTS

Figure 1:
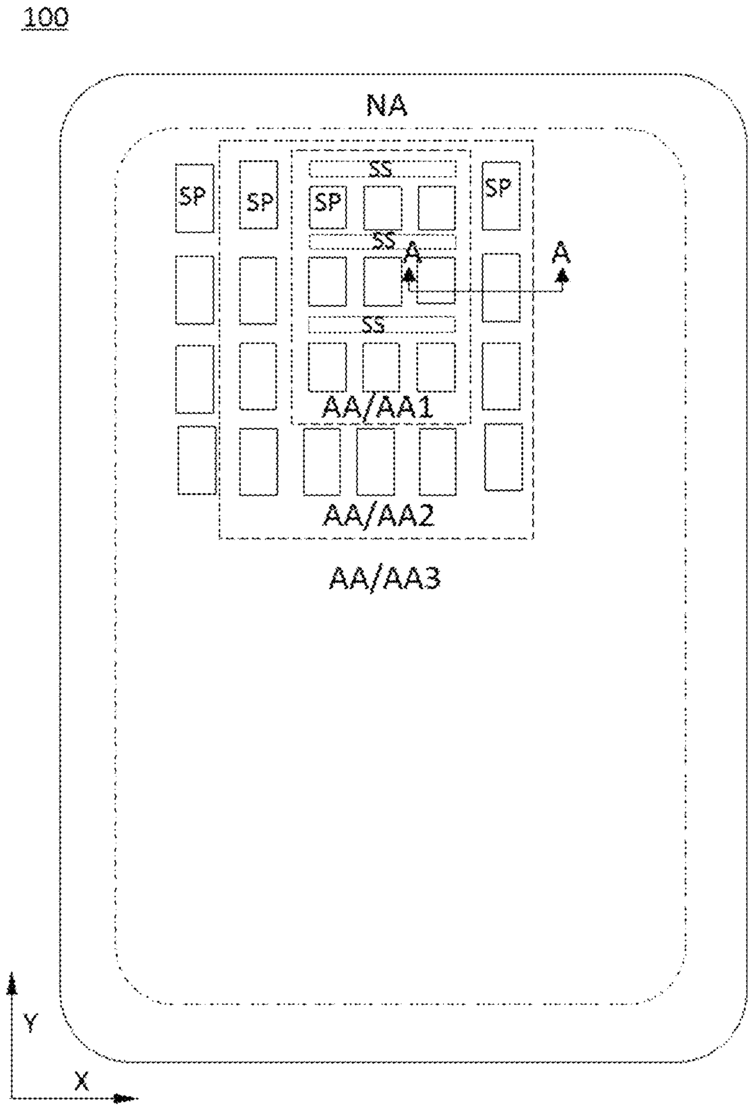
FIG. 1 is a top view of a display panel according to embodiments of the present disclosure.

In order to clearly describe the objectives, features and advantages of the present disclosure, the present disclosure is further described with reference to accompanying drawings and various embodiments hereinafter.

The details described in the following description are used to substantially understand the present disclosure. However, the present disclosure may be implemented in various other manners which are different from those described herein, and those skilled in the art may make similar generalizations without departing from the connotation of the present disclosure. Therefore, the present disclosure is not limited by various embodiments disclosed below. In the following description, same reference numerals in the drawings indicate same or similar structures, and thus their repeated description may be omitted.

Terms in the embodiments of the present disclosure are merely used to describe the specific embodiments, and are not intended to limit the present disclosure. Unless otherwise specified in the context, words, such as "a", "the", and "this", in a singular form in the embodiments of the present disclosure and the appended claims include plural forms.

The terms used in the embodiments of the present disclosure are only for the purpose of describing the embodiments but are not intended to limit the present disclosure. It should be noted that "upper", "lower", "left", "right" and other directional words described in the embodiments of the present disclosure are described from the angle shown in the drawings, and should not be construed as limiting the embodiments of the present disclosure. In addition, in the context, it should be understood that when it is mentioned that an element is formed "on" or "under" another element, it can not only be directly formed "on" or "under" another element, but also indirectly formed "on" or "under" another element through an intermediate element.

Exemplary embodiments can be implemented in various forms, and should not be construed as being limited to embodiments set forth herein; on the contrary, the provision of such embodiments makes the present disclosure more comprehensive and complete, and fully conveys the concept of exemplary embodiments to those skilled in the art. Same reference numerals in the drawings represent same or similar structures, and thus their repeated description may be omitted. The terms expressing position and direction described in the present disclosure are all illustrated by taking the drawings as examples, but can also be changed according to needs; and such changes are all included in the protection scope of the present disclosure. The drawings of the present disclosure are only used to illustrate the relative position relationship. The layer thicknesses of some parts may be drawn in an exaggerated way to facilitate understanding. The layer thicknesses in the drawings may not represent the proportional relationship of the actual layer thicknesses. In addition, in the case of no conflict, various embodiments of the present disclosure and the features in various embodiments can be combined with each other. The drawings of various embodiments in the present application may use same reference numerals. Furthermore, the similarities between various embodiments may not be repeated.

Figure 2:
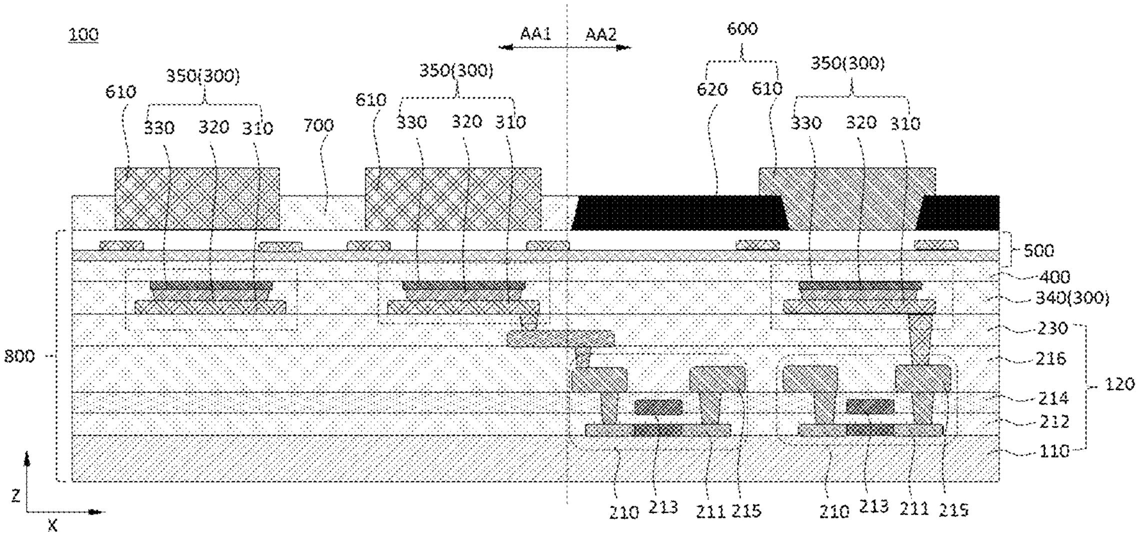
FIG. 2 is a partial cross-sectional view taken along line A-A in FIG. 1 according to an embodiment of the present disclosure.

FIG. 1 is a top view of a display panel according to embodiments of the present disclosure. FIG. 2 is a partial cross-sectional view taken along line A-A in FIG. 1 according to an embodiment of the present disclosure. The sectional plane is perpendicular to a plane of the display panel.

As shown in FIG. 1 and FIG. 2, a display panel 100 may be divided into a display region AA and a non-display region NA surrounding the display region AA. It should be understood that the dotted box in FIG. 1 is used to illustrate the boundary between the display region AA and the non-display region NA. The display region AA of the display panel 100 is used for displaying images and typically includes a plurality of pixels sp arranged in an array. Each pixel sp includes a corresponding light-emitting element (e.g., a diode) and control elements (e.g., thin-film transistors that constitute a pixel drive circuit). The non-display region NA surrounds the display region AA and typically includes periphery drive circuits, periphery wires, and a fan-out region.

In some embodiments, the display region AA of the display panel 100 includes a first display region AA1. Specifically, the first display region AA1 is a part of the display region AA. In some embodiments, the first display region AA1 includes a light-transmitting region SS, so the first display region AA1 has a higher light transmittance to external light. In this way, the first display region AA1 may be used for arranging optical functional elements. For example, devices integrated with light sensors, such as a camera and a fingerprint recognition structure, can be installed underneath the first display region AA1. As a result, in addition to light emitting display, the first display region AA1 can also realize optical signal transmission, such as at least one of photographing, biometrics recognition, and the like. In some embodiments, the first display region AA1 is a CUP region.

In some embodiments, the display panel further includes a non-light-transmitting region, and the non-light-transmitting region includes a region where a light-emitting element 350 is arranged. In some embodiments, some circuit structures or drive elements, such as wirings, thin-film transistors and the like, are also arranged in the non-light-transmitting region. The light-transmitting region SS is formed by removing a part of a light-blocking structure in the display panel, so there is no light blocking material in this region that blocks light transmitting, thereby forming the light-transmitting region SS.

In some embodiments, the display panel may further include a second display region AA2.

In some embodiments, the second display region AA2 is a part of the display region AA. Specifically, the display region AA includes the first display region AA1 and the second display region AA2. The second display region AA2 and the first display region AA1 are adjacent to each other, and a light transmittance of the second display region AA2 is less than that of the first display region AA1. That means, the first display region AA1 and the second display region AA2 are different regions of the display region AA, and the first display region AA1 has a higher transmittance to the external light than the second display region AA2. In addition, the second display region AA2 may at least partially surround the first display region AA1.

In the embodiment shown in FIG. 1, the second display region AA2 completely surrounds the first display region AA1. Of course, in some other embodiments of the present disclosure, the second display region AA2 partially surrounds the first display region AA1. The first display region AA1 may be one of shapes circle, oval, rectangle, and the like.

In some embodiments, the display panel 100 includes a display function layer 800. The display function layer 800 includes the light-emitting elements 350. Specifically, the display function layer 800 includes an array substrate 120, a light-emitting function layer 300 and an encapsulation layer 400 that are stacked sequentially.

In some embodiments, the array substrate 120 includes a substrate 110.

In some embodiments, the substrate 110 is made of a polymeric material including glass, polyimide (PI), polycarbonate (PC), polyethersulfone (PES), polyethylene terephthalate (PET), polyethylene naphthalate (PEN), polyarylate (PAR), glass fiber reinforced plastic (FRP) and/or any other suitable material(s). The substrate 110 may be transparent, translucent or opaque.

In some embodiments, the substrate 110 may be flexible or may be rigid. It should be understood that, as mentioned in various embodiments of the present application, the expression a certain layer is "on" a certain reference layer can be understood as the certain layer being on the reference layer "on the side away from the substrate". In addition, in the absence of explicit expression, "upper" may only indicate the orientation relationship, and may not indicate that the two layers must be adjacent or in contact with each other.

In some embodiments, the array substrate 120 may further include a buffer layer (not shown in the figures) on the substrate 110, and the buffer layer may cover an entire upper surface of the substrate 110.

In some embodiments, the array substrate 120 further includes a pixel circuit and a drive module for controlling the light-emitting element 350.

Specifically, the array substrate 120 includes a plurality of pixel circuits located in the display region AA and a drive module located in the non-display region NA. In some embodiments, the plurality of pixel circuits and the drive module are located on a side of the substrate 110 facing toward a display surface or a touch surface of the display panel 100.

The array substrate 120 may further include a plurality of thin film transistors (TFTs) 210. The TFTs 210 constitute the pixel circuits for controlling the light emitting of the light-emitting elements 350.

A top-gate thin film transistor may be taken as an example for the structural description in various embodiments of the present disclosure. The thin film transistor 210 includes an array layer 211 located on the substrate 110. The active layer 211 may be made of an amorphous silicon material, a poly silicon material, a metal oxide material or the like. When the active layer 211 is made of polycrystalline silicon, the active layer 211 is formed using a low temperature amorphous silicon technology. That is, the amorphous silicon is transformed to polycrystalline silicon through crystallization by laser. Various methods such as rapid thermal annealing (RTA), solid-phase crystallization (SPC), excimer laser annealing (ELA), metal-induced crystallization (MIC), metal-induced lateral crystallization (MILC) or continuous lateral curing (SLS) may be used for the crystallization process. The active layer 211 may further include a source region and a drain region formed by doping N-type impurity ions or P-type impurity ions, and a channel region between the source region and the drain region.

The thin film transistor 210 further includes a gate insulation layer 212 on the active layer 211. The gate insulation layer 212 may include an inorganic layer such as silicon oxide or silicon nitride, and may include a single layer or multiple layers.

The thin film transistor 210 further includes a gate electrode 213 on the gate insulation layer 212. The gate electrode 213 may include a single layer or multiple layers of gold (Au), silver (Ag), copper (Cu), nickel (Ni), platinum (Pt), palladium (Pd), aluminum (Al), molybdenum (MO), or chromium (Cr). Or the gate electrode 213 may include alloys such as aluminum (Al) neodymium (Nd) alloy and molybdenum (MO) tungsten (W) alloy.

The thin film transistor 210 further includes an interlayer insulation layer 214 located on the gate electrode 213. The interlayer insulation layer 214 may be formed by an inorganic insulating layer of silicon oxide, silicon nitride and/or the like. Of course, in other embodiments of the present disclosure, the interlayer insulation layer 214 is made of an organic insulating material.

The thin film transistor 210 further includes a source/drain electrode layer 215 located on the interlayer insulation layer 214. The source/drain electrode layer 215 may include a source electrode and a drain electrode. The source electrode and the drain electrode may be respectively electrically connected (or coupled) to the source region and the drain region through contact vias. The contacts via may be formed by selectively removing the gate electrode insulation layer 212 and the interlayer insulation layer 214.

The array substrate 120 may further include a passivation layer 216. For example, the passivation layer 216 may be located on the source electrode and the drain electrode of the thin film transistor 210. The passivation layer 216 may be formed of an inorganic layer such as silicon oxide or silicon nitride or formed of an organic layer.

The array substrate 120 may further include a planarization layer 230. In some embodiments, the planarization layer 230 is located on the passivation layer 216. The planarization layer 230 may be made of an organic material such as acrylic, polyimide (PI), benzocyclobutene (BCB), and the like. The planarization layer 230 provides a flat surface.

In some embodiments, the display panel 100 includes a plurality of pixels sp.

In some embodiments, the pixel sp includes a light-emitting element 350.

Specifically, the display function layer 800 of the display panel 100 further includes a light-emitting function layer 300 located on a side of the array substrate 120 away from the substrate 110. The light-emitting function layer 300 includes a plurality of light-emitting elements 350. In some embodiments, the light-emitting elements 350 are located on the side of the array substrate 120 away from the substrate 110. In some embodiments, the light-emitting function layer 300 is located on the planarization layer 230 and includes: an anode layer 310, an organic light-emitting material 320 and a cathode layer 330 that are sequentially arranged along a direction away from the substrate 110.

In some embodiments, the light-emitting function layer 300 further includes a pixel define layer 340 located on a side of the anode layer 310 away from the substrate 110. The pixel define layer 340 may be made of an organic material such as polyimide (PI), polyamide, benzocyclobutene (BCB), acrylic resin or phenolic resin, or made of an inorganic material such as SiNx.

In some embodiments, the anode layer 310 includes a plurality of anode patterns that is in one-to-one correspondence with the plurality of pixels sp. The anode patterns of the anode layer 310 are respectively connected to the source electrodes or drain electrodes of the thin film transistors 210 through vias in the planarization layer 230. The pixel define layer 340 is located on the side of the anode layer 310 away from the substrate 110 and includes a plurality of openings exposing the anode layer 310. The pixel define layer 340 covers the edges of the anode patterns of the anode layer 310. The organic light-emitting material 320 is at least partially filled within the openings of the pixel define layer 340 and is in contact with the anode layer 310.

In some embodiments, each opening of the pixel define layer 340 defines a stack of anode layer 310, the organic light-emitting material 320 and the cathode layer 330, and the stack of anode layer 310, the organic light-emitting material 320 and the cathode layer 330 constitutes the light-emitting element 350 (as shown by the dashed-line frame in FIG. 2). The light-emitting elements 350 emit lights of different colors according to the different organic light-emitting materials 320 in the light-emitting elements 350. Each light-emitting element 350 constitutes a pixel sp. In other words, each light-emitting element 350 and a pixel circuit controlling the light-emitting element 350 together constitute one pixel. The plurality of pixels perform image displaying together. It should be noted that a periphery of the pixel refers to a periphery of the light-emitting element. That means, when the pixel periphery is used for defining the position of an auxiliary structure descried below, the boundary of the pixel is defined by the boundary of the light-emitting element. The periphery of the light-emitting element is the periphery of the pixel. In other words, a region of the pixel may be the region of the opening of the pixel define layer 340 accommodating the light-emitting element, the boundary of the pixel is the boundary of the opening of the pixel define layer, and the periphery of the pixel is the periphery of the opening of the pixel define layer.

In some embodiments, one or more insulation layers in the array substrate 120 are made of a black material or other light-blocking material. For example, the pixel define layer 340 or the planarization layer 230, the passivation layer 216 are made of a black material or other light-blocking material, which can prevent the external ambient light or light emitted by the light-emitting element from reaching the drive device (for example, the active layer of the thin film transistor), affecting the electrical performance of the drive device. The black material or other light-blocking material in the light-transmitting region SS needs to be removed. For example, the black pixel define layer BPDL is etched at the light-transmitting regions SS to form a hollowed structure.

In some embodiments, in the light-transmitting regions SS, one or more layers or structures (for example the pixel circuit) of the display panel needs to be removed or transferred to another region, so as to improve the light transmittance of the first display region. In some embodiments, an insulation layer in the array substrate of the display panel is hollowed at the light-transmitting region SS. In some embodiments, the entire of the substrate in the display panel is kept.

In some embodiments, the organic light-emitting material 320 may be formed in the opening of the pixel define layer 340 using inkjet printing, nozzle printing, evaporation methods and the like. The cathode layer 330 may be formed on the layer of the organic light-emitting material 320 using the evaporation method. In some embodiments, the cathode layer 330 may be an entire layer covering the organic light-emitting material 320 and the pixel define layer 340.

In some embodiments, the display panel 100 further includes an encapsulation layer 400 located on the light-emitting function layer 300 and completely covering the light-emitting function layer 300 so as to seal the light-emitting function layer 300. It should be understood that, as mentioned in various embodiments of the present application, the term "on" can be understood as "on the side away from the substrate". In some embodiments, the encapsulation layer 400 may be a thin film encapsulation layer located on the cathode layer 330 and including a first inorganic encapsulation layer, a first organic encapsulation layer and a second inorganic encapsulation layer that are sequentially arranged in the direction away from the substrate. Of course, in other embodiments of the present disclosure, the encapsulation layer 400 may include a stacking of any number of organic material layers and inorganic material layers according to needs, but the stacking at least includes one organic material layer and at least one inorganic material layer that are alternately deposited, and the topmost layer and bottommost layer of the stacking are made of inorganic material.

In some embodiments, the display panel further includes a color filter layer 600. The color filter layer 600 is located on a side of the display function layer 800 facing the display surface of the display panel 100. The color filter layer 600 includes color resists 610 provided corresponding to the light-emitting elements 350 respectively.

The color resist 610 is located on the side of the light-emitting element 350 facing the light-exiting surface of the display panel 100. The color resist 610 can filter the light emitted by the light-emitting element 350 such that the chromaticity of the light emitted by the light-emitting element 350 is purer when exiting the display panel 100.

In some embodiments, the display panel further includes auxiliary structures 700 located on the side of the display function layer 800 facing the display surface of the display panel 100.

In some embodiments, the auxiliary structure 700 is a light-transmitting structure, and is at least located between adjacent color resists 610 and overlaps with the light-transmitting region SS. That means, an orthographic projection of the auxiliary structure 700 on the plane of the display panel is at least located in the gap between the orthographic projections of the color resists 610 on the plane of the display panel. In addition, the orthographic projection of the auxiliary structure 700 on the plane of the display panel overlaps with the light-transmitting region SS of the display panel.

In some embodiments, the auxiliary structure 700 is located on a side of the encapsulation layer 400 away from the light-emitting function layer 300.

In some embodiments, the auxiliary structure 700 is located in the periphery of the color resist 610 in the first display region AA1. The orthographic projection of the auxiliary structure 700 on the plane of the substrate 110 is located in the periphery of the orthographic projection of the color resist 610 on the plane of the substrate 110. In some embodiments, the orthographic projection of the auxiliary structure 700 on the plane of the substrate 110 is located between orthographic projections of two adjacent color resists 610 on the plane of the substrate 110.

Since the CUP region has a high light transmittance, the CUP region and the normal display region are different in layer structure. For example, the layer formed of the black material or other light-blocking material in the light-transmitting region SS is not included, causing a reduced thickness of the display panel in the light-transmitting region. There are layers formed after the black material or other light-blocking material in the light-transmitting region is removed (that is, located on the side away from the substrate), the upper surface of the display panel (not completely finished) for supporting the subsequent-formed layer has a great height unevenness. Therefore, the subsequent-formed layer has different morphologies in the CUP region and the non-CUP region.

The forming process of the color resists has a lower order ranking in the entire process of the display panel, so the color resist has different structures in the CUP region and the non-CUP region. In an embodiment, the thickness of the color resist in the CUP region and the thickness of the color resist in the non-CUP region are different due to the above reason.

In this embodiment, the first display region is provided with the auxiliary structure, which can reduce the thickness difference between the CUP region and the normal display region. For example, by the auxiliary structure, the absence of the layer formed of the black material or other light-blocking material in the light-transmitting region SS is compensated.

It is found that due to the absence of the layer formed of the black material or other light-blocking material in the light-transmitting region, when forming the color resists, the thickness of the color resist coated in the CUP region is less than the thickness of the color resist coated in the non-CUP region since the filling rate of other layers is low. As a result, the display effect of the CUP region and the display effect of the normal display region are different.

In this embodiment, the auxiliary structure is located on the side of the color resist facing the display surface of the display panel, and is disposed in the periphery of the color resist in the light-transmitting region, so the affecting of the light-transmitting region around the color resist in the first display region on the thickness of the color resist is compensated, thereby reducing the difference between the display effect of the CUP region and the display effect of the normal display region.

In embodiments of the present disclosure, the expression that the auxiliary structure is located in the "periphery" of the color resist means that the auxiliary structure and the color resist are disposed adjacent to each other, the auxiliary structure and the color resist may be spaced by a certain distance or a non-color-resist structure, but there is no other color resist between the auxiliary structure and the color resist.

In some embodiments, the display panel further includes a touch function layer 500.

In some embodiments, the touch function layer 500 is located on the side of the display function layer 800 facing the display surface of the display panel 100.

In some embodiments, the touch function layer 500 is located on the encapsulation layer 400 of the display panel 100. That means the touch function layer 500 is located on the side of the encapsulation layer 400 away from the light-emitting element.

In some embodiments, the touch function layer 500 is located between the encapsulation layer 400 and the color filter layer 600, which will be described in detail below.

In some embodiments, a protection layer is provided on the side of the color filter layer 600 away from the light-emitting element.

In some embodiments, the auxiliary structure 700 and the color resist 610 overlap along the first direction X. The first direction X is parallel to the plane of the display panel 100. Accordingly, the auxiliary structure 700 and the color resist 610 overlap along a lateral direction.

In this way, the auxiliary structure fills the coating space of the color resist in the CUP region, so the limited color resist material can form a larger thickness in the CUP region, thereby further reducing the difference between the display effect of the CUP region and the display effect of the normal display region.

Figure 3:
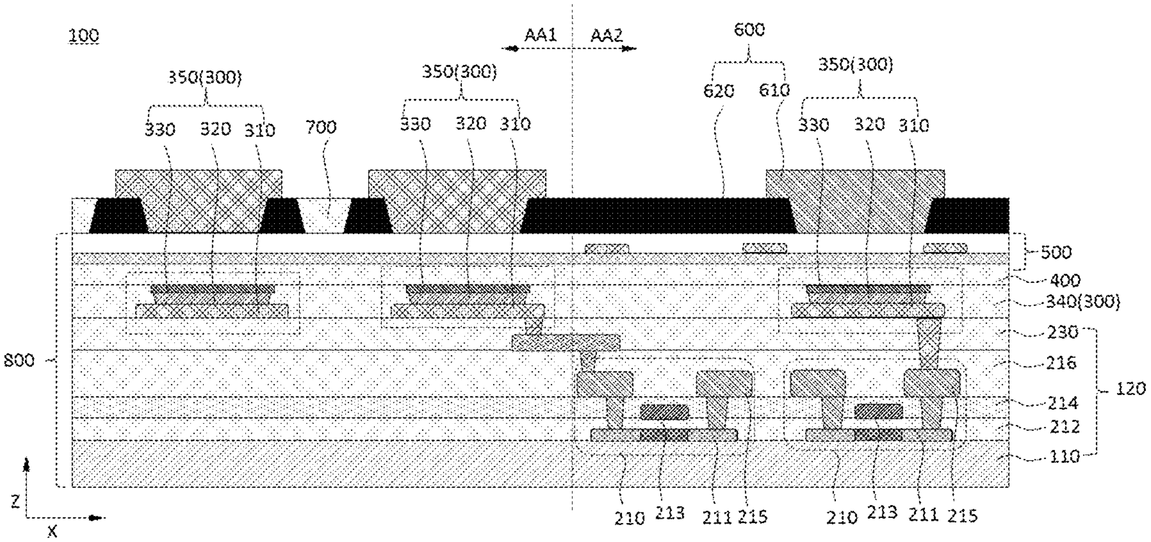
FIG. 3 is another partial cross-sectional view taken along line A-A in FIG. 1 according to an embodiment of the present disclosure.

FIG. 3 is another partial cross-sectional view taken along line A-A in FIG. 1. The sectional plane is perpendicular to the plane of the display panel. In some embodiments, as shown in FIG. 3, the color filter layer 600 further includes a light-blocking layer 620 located in the periphery of the color resist 610.

In some embodiments, the structure of the light-blocking layer 620 is similar to that of a black matrix BM. The light-blocking layer 620 reduces the reflectivity of the display panel, and reduces the mutual interference between the light-emitting elements 350.

In some embodiments, the light-blocking layer 620 is provided surrounding the color resist 610. The light-blocking layer 620 is provided with light-transmitting holes. Some of the light-transmitting holes are disposed in a region for disposing the light-emitting element, and color resists 610 are disposed in theses light-transmitting holes. Another some of the light-transmitting holes are formed as first openings 621.

In some embodiments, the light-blocking layer 620 includes the first opening that exposes the light-emitting region SS. The light-blocking layer 620 is a mesh structure, and the hollowed region of the mesh structure is the light-transmitting region.

Figure 4:
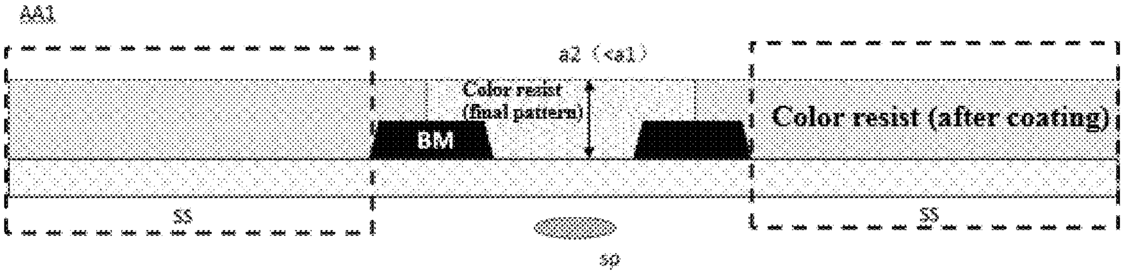
FIG. 4 is a cross-sectional view of a display panel according to an embodiment of the present disclosure.
Figure 5:
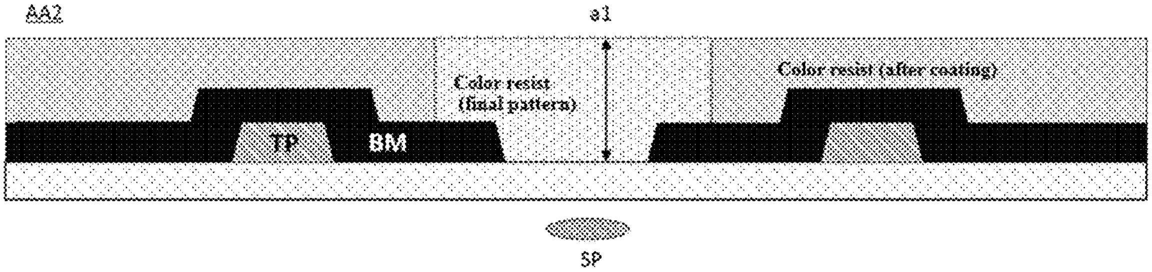
FIG. 5 is a cross-sectional view of another display panel according to an embodiment of the present disclosure.

FIG. 4 and FIG. 5 are cross-sectional views of a display panel according to an embodiment of the present disclosure. As shown in FIG. 4 and FIG. 5, FIG. 4 is a partial cross-sectional view of the first display region, and FIG. 5 is a partial cross-sectional view of the second display region.

In some embodiments, the touch associated structure in the CUP region is removed. Since the CUP region needs a high light transmittance, the light-blocking layer in the light-transmitting region SS is removed. In other words, a black matrix BM is provided. The black matrix BM includes an opening exposing the light-transmitting region SS. After the light-blocking layer is formed, a volume filling rate of the light-blocking layer and the touch associated layer in the CUP region is less than that in the non-CUP region. Next to the formation of the light-blocking layer is the process of forming the color resists. In this way, with the above configuration, the thickness (a2 in FIG. 4) of the color resist material coated in the CUP region is less than the thickness (a1 in FIG. 5) of the color resist material coated in the non-CUP region.

As shown in FIG. 4 and FIG. 5, since the output amount of the equipment is constant, theoretically the color resist material coated per unit area in the first display region AA1 and the color resist material coated per unit area in the second display region AA2 each have a certain total volume. However, since a hollowed part of the black matrix BM arranged below is filled a part of the color resist material coated in the manufacturing process, the thickness of the layer of the color resist material formed in the first display region AA1 is reduced, and the thickness of the color resist left in the first display region AA1 after exposure and development.

Figure 6:
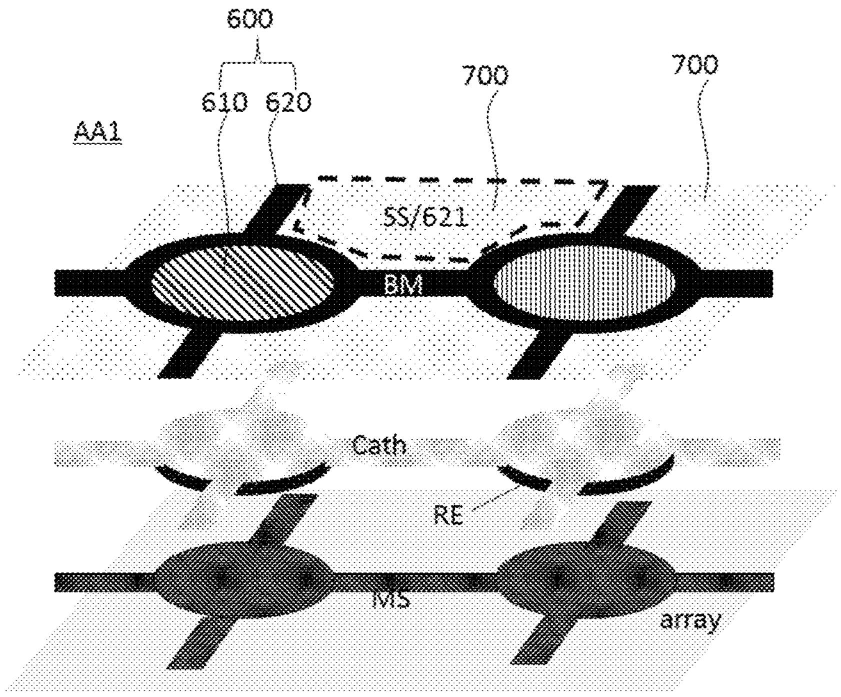
FIG. 6 is a schematic view showing stacked layers in a first display region of the display panel according to embodiments of the present disclosure.
Figure 7:
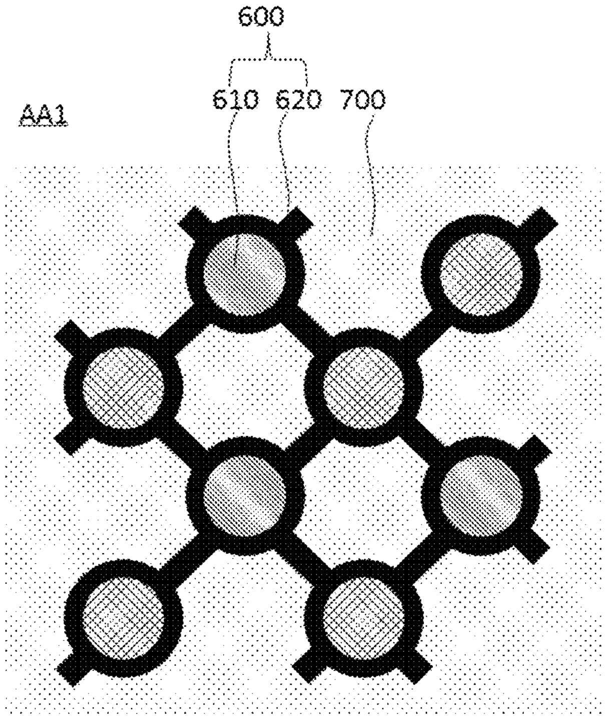
FIG. 7 is an enlarged partial top view of a first display region of the display panel according to embodiments of the present disclosure.

Referring to FIG. 3, FIG. 6 and FIG. 7, FIG. 6 is a schematic view showing stacked layers in a first display region of the display panel according to embodiments of the present disclosure, and FIG. 7 is an enlarged partial top view of a first display region of the display panel according to embodiments of the present disclosure.

In some embodiments, since connection lines of MS/BM are in the gaps between pixels, filling patterns of the auxiliary structures 700 are separated blocks, and the block-shaped auxiliary structures 700 are disposed in different hollowed portions of the light-blocking layer.

In this way, even if the display panel includes the transparent CUP region that causes the proportion of the BM pattern in the CUP region less than that in the non-CUP region, the display uniformity of the transparent CUP region and a transition region is improved by the configuration that a transparent filling layer (the auxiliary structure) is provided between the BM patterns in the transparent CUP region and the auxiliary structure is formed before the process of forming the color resist.

In this embodiment, at least a part of the auxiliary structure 700 is located in the first opening 621. That means, at least a part of the light-blocking 620 forms the edge of the first opening 621 and is contact with the auxiliary structure 700.

In one aspect, the topography of the auxiliary structure is more similar to the topography of the light-blocking layer, so the auxiliary structure compensates the absence of the light-blocking layer more directly, which reduces the difference between the color resist in the CUP region and the color resist in the non-CUP region. In other aspect, the auxiliary structure is integrated and engaged with the light-blocking layer as much as possible to improve the structure stability. In yet another aspect, while improving the display effect through the above principle, additional diffraction interference generated in the gap between the auxiliary structure and the light-blocking layer can be avoided.

In some embodiments, the auxiliary structure 700 overlaps with the light-blocking layer 620 along the first direction X. The first direction X is parallel to the plane of the display panel 100. In other words, the auxiliary structure 700 overlaps with the light-blocking layer 620 in the lateral direction.

In one aspect, the auxiliary structure occupies the coating space of the color resist in the CUP region, so the limited color resist material can form a larger thickness in the CUP region, thereby further reducing the difference between the display effect of the CUP region and the display effect of the normal display region. In another aspect, at least a part of the auxiliary structure is arranged on the same level as the light-blocking layer, the auxiliary structure compensates the absence of the light-blocking layer directly, so the topography of the auxiliary structure is more similar to the topography of the light-blocking layer, further reducing the difference between the color resist in the CUP region and the color resist in the non-CUP region.

In some embodiments of the present disclosure, the auxiliary structure 700 is located in the first opening 621. Further, the auxiliary structure 700 fills the first opening 621.

In some embodiments, the edge of the light-blocking layer 620 is in contact with the edge of the auxiliary structure 700. That means the light-blocking layer 620 is located between the color resist 610 and the auxiliary structure 700. The edge of the light-blocking layer 620 and the edge of the auxiliary structure 700 are adjacent to each other, and the end surface of the light-blocking layer 620 and the end surface of the auxiliary structure 700 are in contact with each other.

Further, the auxiliary structure 700 is completely located in the first opening 621, the volume (capacity) of the first opening 621 is the same as the volume of the auxiliary structure 700. In this way, the topography of the auxiliary structure 700 is more similar to the topography of the light-blocking layer, which further reduce the difference between the color resist in the CUP region and the color resist in the non-CUP region.

Figure 8:
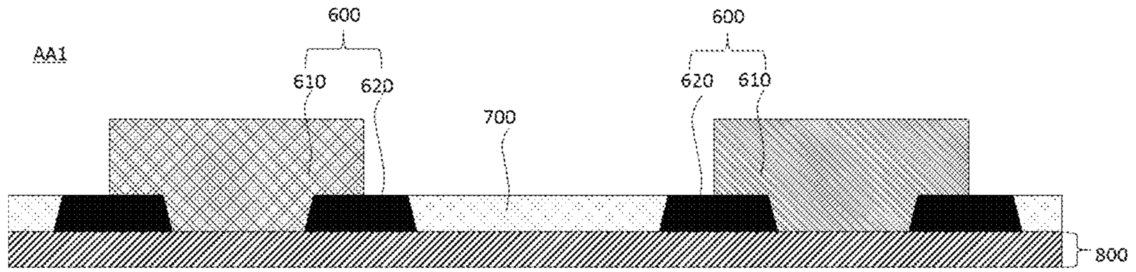
FIG. 8 is an enlarged partial view of the first display region in FIG. 3 according to an embodiment of the present disclosure.

FIG. 8 is an enlarged partial view of the first display region in FIG. 3. In some embodiments, as shown in FIG. 8, a top surface of the auxiliary structure 700 is flush with a top surface of the light-blocking layer 620. That means the top surface of the auxiliary structure 700 and the top surface of the light-blocking layer 620 are in the same plane. It should be understood that a “top surface” of a certain layer structure refers to a surface of the layer structure away from the substrate.

With the above arrangement, the thickness of the auxiliary structure is facing towards the thickness of the light-blocking layer, such that when coating the color resist material in the CUP region and the non-CUP region, the topography of the layer supporting the color resist material in the CUP region is facing towards the topography of the layer supporting the color resist material in the non-CUP region, thereby reducing the thickness difference between the color resists finally formed in the two regions and improving the uniformity of the display panel.

Of course, in some embodiments of the present disclosure, a segment difference between the top surface of the auxiliary structure and the top surface of the light-blocking layer is less than or equal to 0.5 μm. The segment difference direction refers to the direction perpendicular to the display panel, that is, the direction Z shown in FIG. 3. It should be understood that the top surface of the auxiliary structure 700 and the top surface of the light-blocking layer 620 may have a certain segment difference according to other design requirements. However, the inventor found that when the segment difference between the top surface of the auxiliary structure 700 and the top surface of the light-blocking layer 620 is less than or equal to 0.5 μm, other design requirements can be satisfied with reducing the thickness difference between the color resists finally formed in the two regions and improving the uniformity of the display panel.

Figure 9:
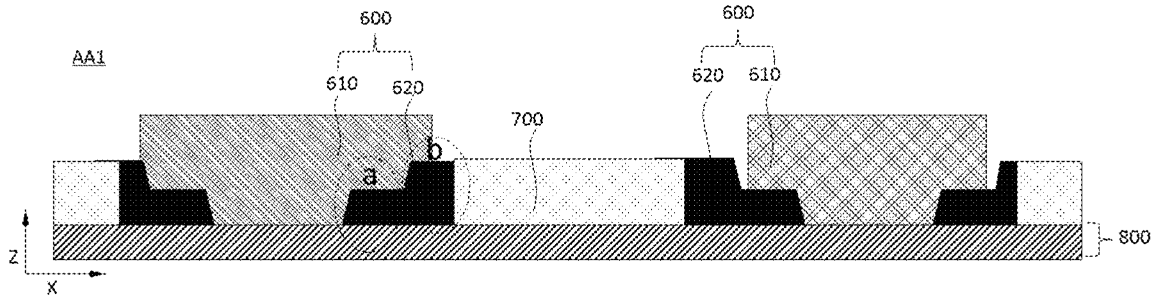
FIG. 9 is another enlarged partial view of the first display region in FIG. 3 according to an embodiment of the present disclosure.

FIG. 9 is another enlarged partial view of the first display region in FIG. 3. As shown in FIG. 9, the light-blocking layer 620 includes a part facing towards the auxiliary structure 700 and a part away from the auxiliary structure 700, and a thickness of the part facing towards the auxiliary structure 700 is greater than a thickness of the part away from the auxiliary structure 700.

Specifically, as shown in FIG. 9, the light-blocking layer includes a region b adjacent to a side wall of the auxiliary structure 700 and a region a located on a side of the region b away from the side where the light-blocking layer contacts the auxiliary structure. The thickness of the region a of the light-blocking layer is less than the thickness of the region b of the light-blocking layer. It should be noted that the thickness mentioned herein refers to the thickness in the direction perpendicular to the plane of the display panel, that is, the direction Z.

In embodiments of the present disclosure, the thickness of the light-blocking layer at the position of the light-transmitting hole for accommodating the color resist is less than the thickness of the light-blocking layer at the position facing towards the sidewall of the auxiliary structure. On the one hand, the effect of the light-blocking layer in defining the color resist is smoothly improved. On the other hand, the effect of the light-blocking layer in blocking leakage light is improved. In addition, while increasing the thickness of the color resist, the stability of the color resist is also improved.

It should be noted that FIG. 9 shows an example in which the light-blocking layer and the auxiliary structure do not overlap in the direction Z. In some other embodiments, the light-blocking layer may overlap with the auxiliary structure. Even if the light-blocking layer and the auxiliary structure overlap, the light-blocking layer located in the second opening or located in the region of the sidewall of a pad still can satisfy the thickness of the part of the light-blocking layer 620 facing towards the auxiliary structure 700 is greater than the thickness of the part of the light-blocking layer 620 away from the auxiliary structure 700, which is descried in the embodiments shown in FIG. 12 to FIG. 14, and FIG. 16 to FIG. 20 set forth below and is not repeated here.

Figure 10:
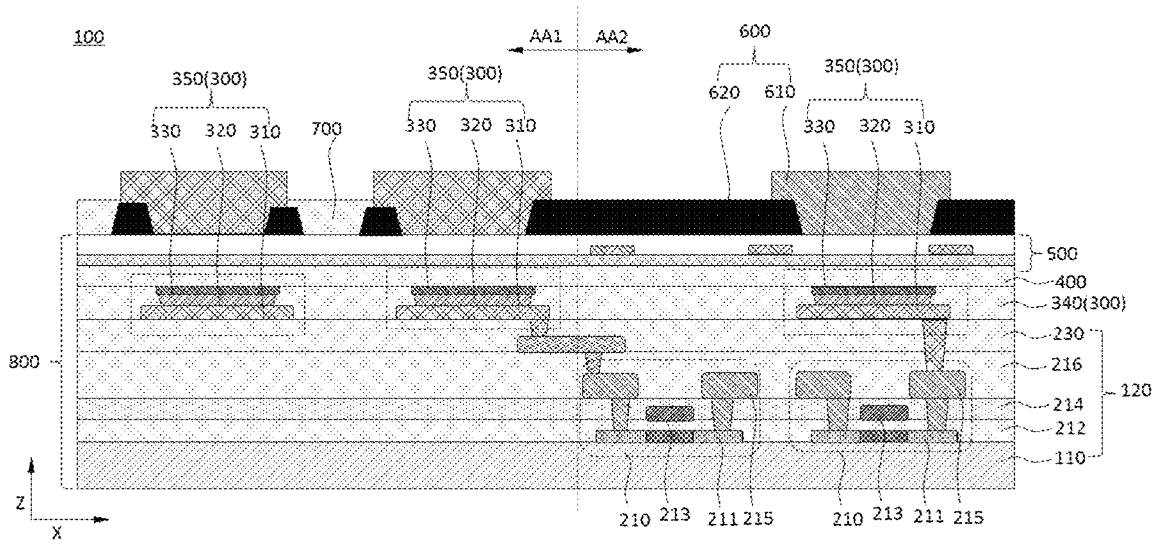
FIG. 10 is another partial cross-sectional view taken along line A-A in FIG. 1 according to an embodiment of the present disclosure.
Figure 11:
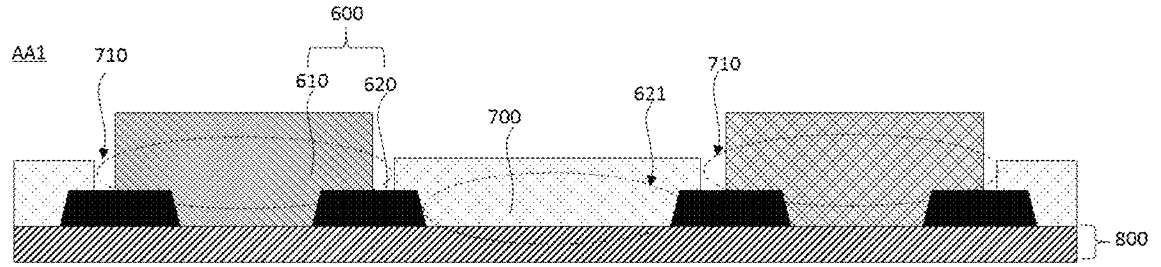
FIG. 11 is an enlarged partial view of the first display region in FIG. 10 according to an embodiment of the present disclosure.
Figure 12:
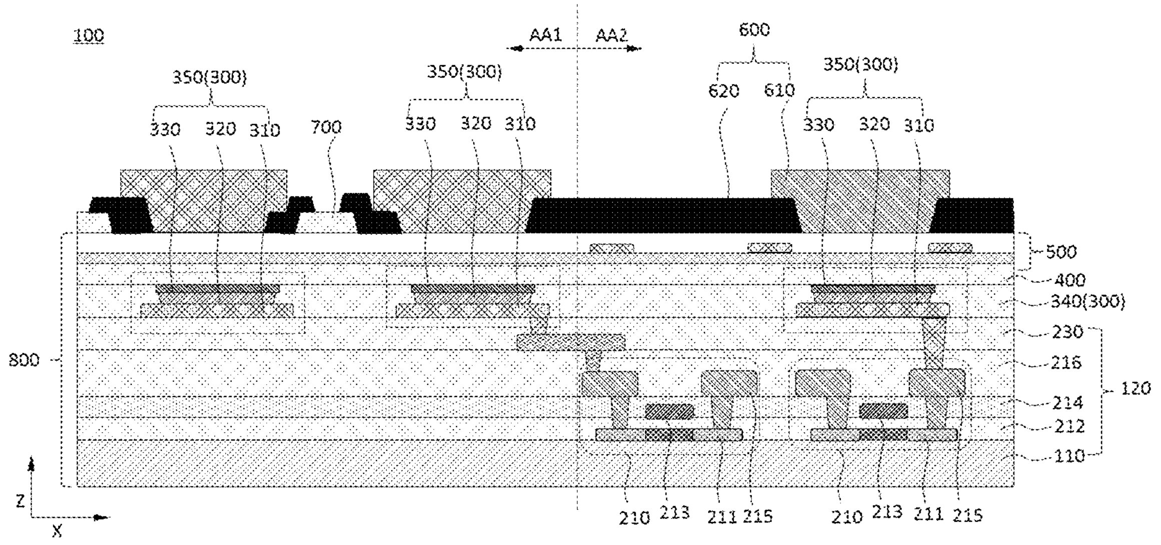
FIG. 12 is another partial cross-sectional view taken along line A-A in FIG. 1 according to an embodiment of the present disclosure.
Figure 13:
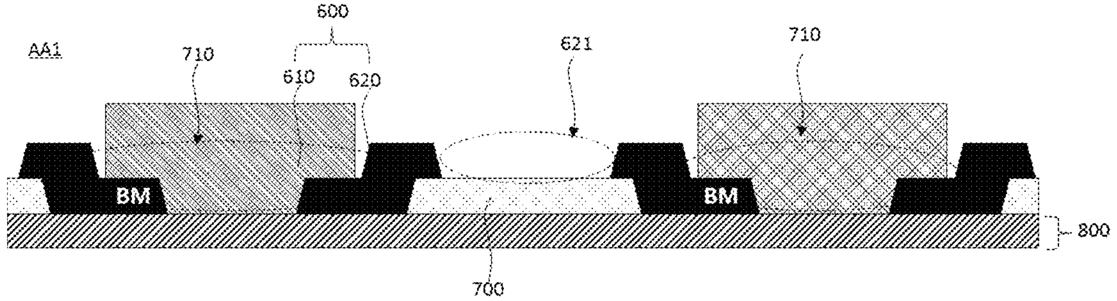
FIG. 13 is an enlarged partial view of the first display region in FIG. 12 according to an embodiment of the present disclosure.

FIG. 10 and FIG. 12 are another two partial cross-sectional views taken along line A-A in FIG. 1. FIG. 11 is an enlarged partial view of the first display region in FIG. 10. FIG. 13 is an enlarged partial view of the first display region in FIG. 12.

As shown in FIG. 10 to FIG. 13, the auxiliary structure 700 overlaps with the edge of the light-blocking layer 620.

The auxiliary structure 700 forms a certain overlap with the light-blocking layer 620. On the one hand, the overlapping region of the auxiliary structure 700 and the light-blocking layer 620 form a thicker stacking structure, and a structure similar to a barrier wall or dam is formed in the periphery of the color resist, so the color resist material is accumulated in the corresponding region more efficiently. On the other hand, while improving the display effect through the above principle, additional diffraction interference generated in the gap between the auxiliary structure and the light-blocking layer can be avoided.

Of course, in some embodiments of the present disclosure, the auxiliary structure 700 overlaps with the light-blocking layer 620, and the thickness of the part of the light-blocking layer 620 facing towards the auxiliary structure 700 is greater than the thickness of the part of the light-blocking layer 620 away from the auxiliary structure 700, which is not described in detail herein.

As shown in FIG. 10 and FIG. 11, the auxiliary structure 700 is at least partially located on the side of the light-blocking layer 620 facing the display surface of the display panel 100. That means the auxiliary structure 700 is formed later than the light-blocking layer, and in the overlapping region of the auxiliary structure and the light-blocking layer, the auxiliary structure is disposed on the light-blocking layer.

In some embodiments, the auxiliary structure 700 overlaps with the edge of the light-blocking layer 620. That means, the auxiliary structure 700 at least covers the edge of the light-blocking layer 620 and coats the light-blocking layer 620 to form the sidewall of the first opening 621.

In this way, in addition to the effect of compensating the thickness difference of the color resists by the stacked structure, the structure stability is improved, and the auxiliary structure is accumulated is assisted by the first opening formed in the light-blocking layer, simplifying the process.

As shown in FIG. 12 and FIG. 13, at least a part of the auxiliary structure 700 is located on the side of the light-blocking layer 620 away from the display surface of the display panel 100. That means the auxiliary structure 700 is formed before the light-blocking layer, and in their overlapping region, the auxiliary structure 700 is below the light-blocking layer.

In some embodiments, the auxiliary structure 700 overlaps with the edge of the light-blocking layer 620. That means the light-blocking layer 620 at least covers the edge of the auxiliary structure 700 and coats the sidewall of the auxiliary structure 700.

On the one hand, due to the presence of the auxiliary structure, a thicker stacking structure is formed in the overlapping region of the auxiliary structure and the light-blocking layer, and a structure similar to a barrier wall or dam is formed in the periphery of the color resist, so the color resist material is accumulated in the corresponding region more efficiently. If even the space in the light-transmitting region where the light-blocking layer is not provided cannot be fully filled by the auxiliary structure due to other requirements, the thickness difference of the color resists can be compensated through the above stacking structure. On the other hand, the light-blocking layer may be set to have a larger blocking area along the vertical direction, that is, the direction Z perpendicular to the plane of the display panel. In other words, along the first direction X, the overlapping area of the color resist and the light-blocking layer is greater, which further reduces the reflection and improves the reflection problem when viewed in a large viewing angle.

Figure 14:
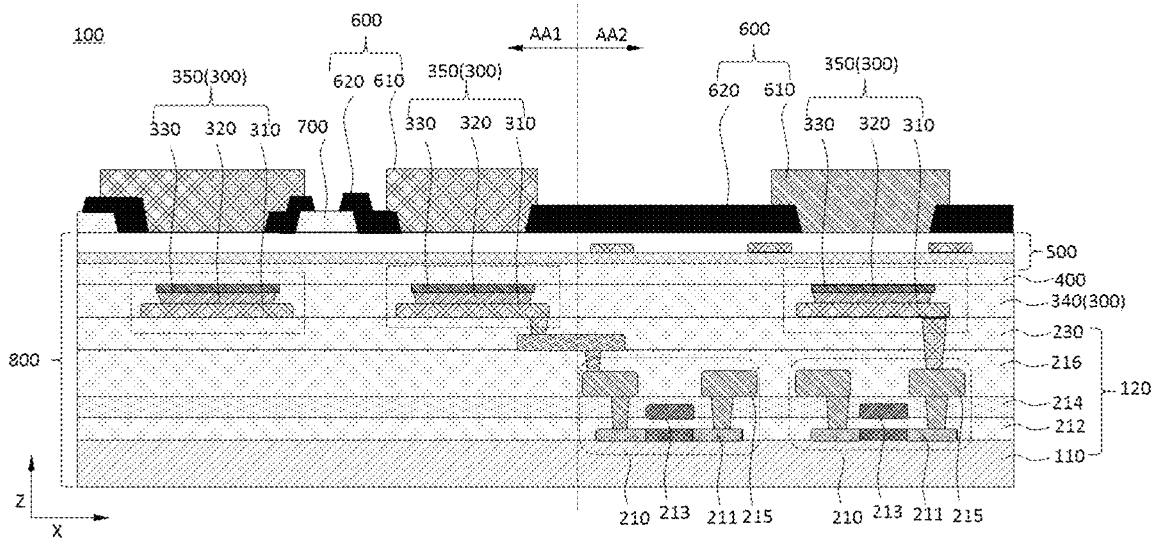
FIG. 14 is another partial cross-sectional view taken along line A-A in FIG. 1 according to an embodiment of the present disclosure.

FIG. 14 is another partial cross-sectional view taken along line A-A in FIG. 1. The sectional plane is perpendicular to the plane of the display panel.

As shown in FIG. 14, in some embodiments, along a direction from a center of the first display region AA1 to the edge of the first display region AA1, the auxiliary structures 700 overlap with the light-blocking layer 620 with decreasing sizes.

In some embodiments, an area by which the auxiliary structure 700 overlaps with the light-blocking layer 620 gradually reduces.

That is, along the direction from the center of the first display region AA1 to the edge of the first display region AA1, the overlapping area of the auxiliary structure 700 and the light-blocking layer 620 gradually reduces. Accordingly, along the direction from the edge of the first display region AA1 to the center of the first display region AA1, the stabilizing and accumulating effects on the color resist provided by the overlapping structure formed by the auxiliary structure 700 and the light-blocking layer 620 gradually increases.

It should be noted that in the above description, comparison is made between the sizes of the overlapping structures respectively in the peripheries of two color resists arranged along the direction from the center of the first display region AA1 to the edge of the first display region AA1, and the size of the overlapping structure refers to the size of the overlapping region between the auxiliary structure and the light-blocking layer.

It should be noted that the term "size" may refer to an area, or may refer to a length of the overlapping region along the direction from the center of the first display region AA1 to the edge of the first display region AA1.

In some embodiments, the edge of the first display region AA1 is connected to the second display region AA2. The light transmittance of the second display region AA2 is less than the light transmittance of the first display region AA1. In some embodiments, unlike the first display region AA1, the second display region AA2 does not include a light-transmitting region. Or, in some embodiments, the second display region AA2 includes a light-transmitting region, but the area of the light-transmitting region of the second display region AA2 is less than the area of the light-transmitting region of the first display region AA1.

It should be understood that since the light transmittance of the second display region AA2 is different from that of the first display region AA1, some structures are different in the first display region AA1 and the second display region AA2, for example, the shapes and sizes of the pixels, and the hollow design of the light-blocking layer, the black pixel define layer or other structures. These structures have different arrangements in the first display region and the second display region, so the approximate location of the boundary between the first display region and the second display region can be found according to these structures. However, the color resists of the same color located in the first display region and the second display region are formed simultaneously and the first display region is connected to the second display region, the thickness of the color resist material coated in the two display regions in the manufacturing process gradually changes rather than suddenly changes at the boundary between the first display region and the second display region.

In this embodiment, such configuration provides a smooth transition, such that the compensation degree of the auxiliary structure on the thickness of the color resist changes according to different positions in the first display region, thereby better improving the thickness difference problem of the color resists and further improving the display effect of the display panel.

Figure 15:
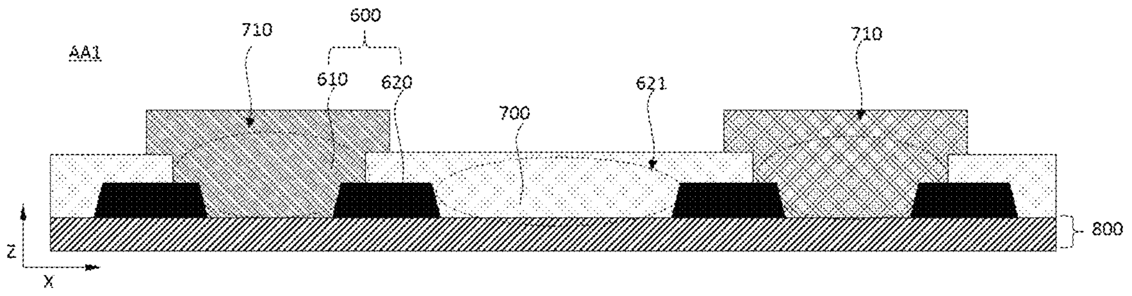
FIG. 15 is an enlarged partial view of another display panel according to embodiments of the present disclosure.
Figure 16:
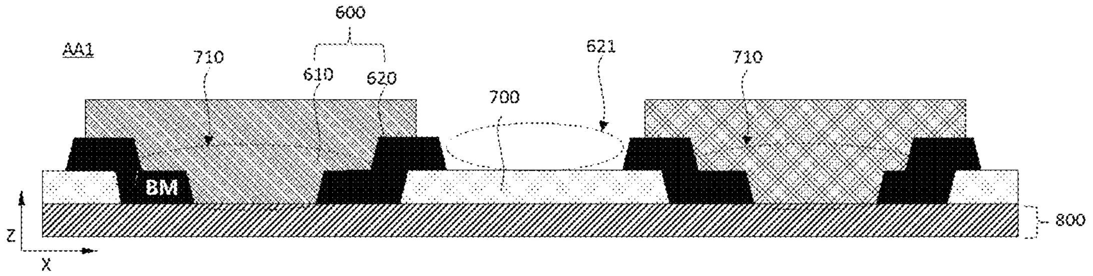
FIG. 16 is an enlarged partial view of another display panel according to embodiments of the present disclosure.

FIG. 15 is an enlarged partial view of another display panel according to embodiments of the present disclosure. FIG. 16 is an enlarged partial view of another display panel according to embodiments of the present disclosure. The similarities between the embodiments shown in FIG. 15 and FIG. 16 and the above embodiments will not be repeated. A difference between the embodiments shown in FIG. 15 and FIG. 16 and the above embodiments is that the auxiliary structure 700 at least partially overlaps with the color resist 610. That means the orthographic projection of the auxiliary structure 700 on the plane of the display panel overlaps with the orthographic projection of the color resist 610 on the plane of the display panel, and the projection direction is the direction Z.

In some embodiments, the color resist 610 covers the edge of the auxiliary structure 700.

In some embodiments, as shown in FIG. 15, at least a part of the auxiliary structure 700 is located on the side of the light-blocking layer 620 away from the display surface of the display panel 100.

In some embodiments, the color resist 610 covers the edge of the auxiliary structure 700 and is at least partially in contact with the auxiliary structure 700. In this way, in addition to improving the display effect, a local slit which may cause residue of a layer formed subsequently or reflection increasing is avoided.

In some embodiments, as shown in FIG. 16, at least a part of the auxiliary structure 700 is located on the side of the light-blocking layer 620 adjacent to the display surface of the display panel 100.

In some embodiments, the auxiliary structure 700 overlaps with the edge of the light-blocking layer 620. That means the light-blocking layer 620 at least covers the edge of the auxiliary structure 700 and coats the side wall of the auxiliary structure 700. In this way, although the projection of the color resist 610 covers the edge of the auxiliary structure 700, the color resist 610 and the auxiliary structure 700 are spaced apart by the light-blocking layer 620.

In the above arrangement, the auxiliary structure, the light-blocking layer and the color resist form an overlapping structure. On the one hand, the overlapping region of the auxiliary structure and the light-blocking structure forms a higher stacking structure similar to a barrier wall or a dam, and the color resist is formed in this structure, thereby more effectively accumulating the color resist material in the corresponding region. In this way, even if the space in the light-transmitting region where the light-blocking layer is not provided cannot be fully filled by the auxiliary structure due to other requirements, the thickness difference of the color resists can be compensated through the above stacking structure. On the other hand, while improving the display effect through the above principle, additional diffraction interference generated in the gap between the auxiliary structure and the light-blocking layer can be avoided. In addition, the stacking of the three layers can increase the area of the part of the light-blocking layer covered by the color resist, and further decrease reflection.

Figure 17:
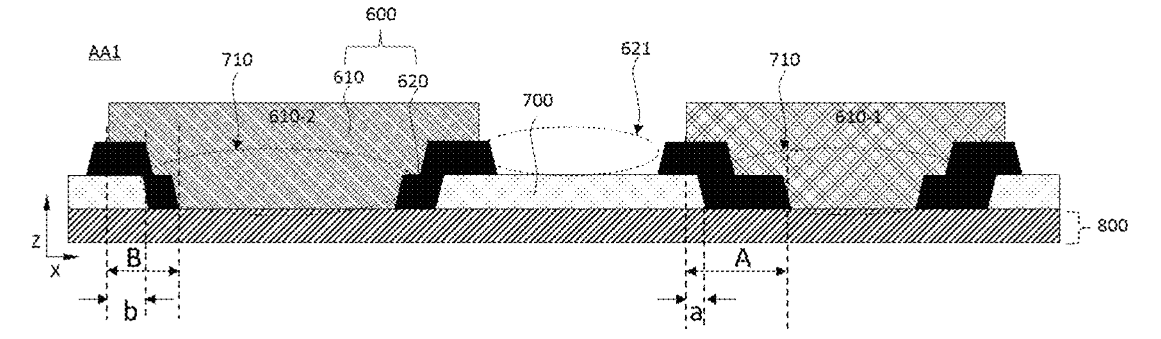
FIG. 17 is an enlarged partial view of a first display region of a display panel according to embodiments of the present disclosure.

FIG. 17 is an enlarged partial view of a first display region of a display panel according to embodiments of the present disclosure.

In some embodiments, the light-blocking layer at least partially overlaps with the color resist, and different color resists overlap with the light-blocking layers by different sizes, and/or the auxiliary structure at least partially overlaps with the color resist, and different color resists overlap with the auxiliary structures by different sizes.

In some embodiments, the light-blocking layer at least partially overlaps with the color resist, and different color resists overlap with the light-blocking layers by different areas, and/or the auxiliary structure at least partially overlaps with the color resist, and different color resists overlap with the auxiliary structures by different areas.

In other words, the overlapping area of the first color resist 610-1 and the light-blocking layer 620 (i.e., the black matrix BM) is A, the overlapping area of the second color resist 610-2 and the light-blocking layer 620 is B, $A \neq B$.

Alternatively, the overlapping area of the first color resist 610-1 and the auxiliary structure 700 is a, the overlapping area of the second color resist 610-2 and the auxiliary structure 700 is b, $a \neq b$.

It should be noted that the overlapping area may be 0. Of course, in some embodiments, "A", "B", "a" and "b" may represent distances. As shown in Figures, the distance may be the distance or length along the direction from the center of the second opening 710 to the first opening 621 adjacent to the second opening 710.

In this embodiment, the auxiliary structures compensate color resists of different colors dedicatedly.

In some embodiments, $A > B$, and $a < b$.

For example, the first color resist is a green color resist and provided corresponding to the green light-emitting element, and the second color resist is a blue or red color resist. Compared with the second color resist, the first color resist overlaps with the black matrix BM by a larger area, which can improve other light-emitting problem of the green pixel. Moreover, compared with the first color resist, the second color resist overlaps the auxiliary structure by a larger area, which can improve the light-emitting problem of a certain color pixel and improve the uniformity of the thicknesses of the color resists of different colors located in the first display region.

Figure 18:
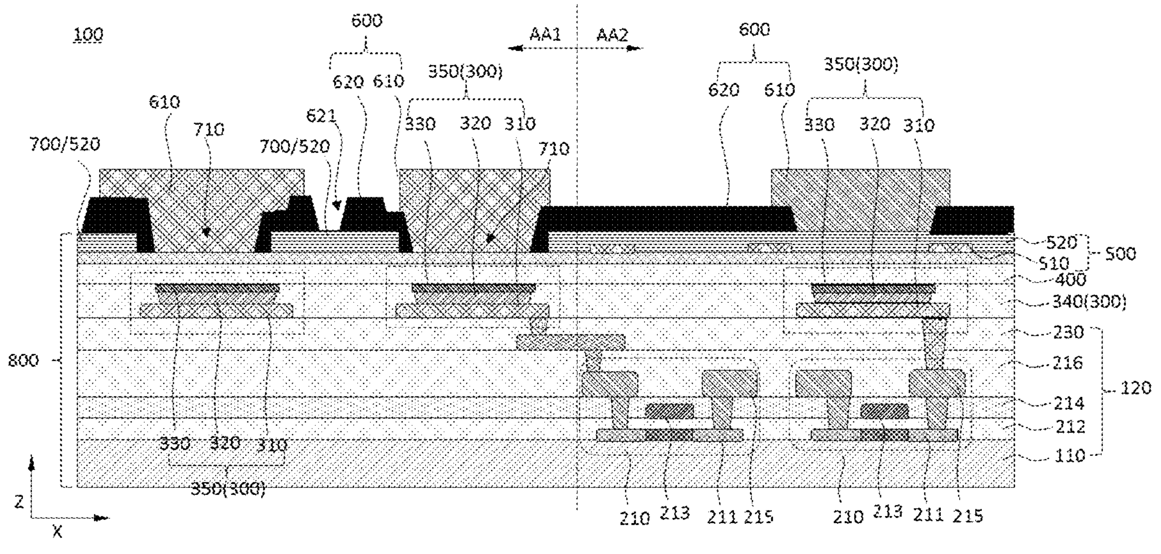
FIG. 18 is another partial cross-sectional view taken along line A-A in FIG. 1 according to an embodiment of the present disclosure.
Figure 19:
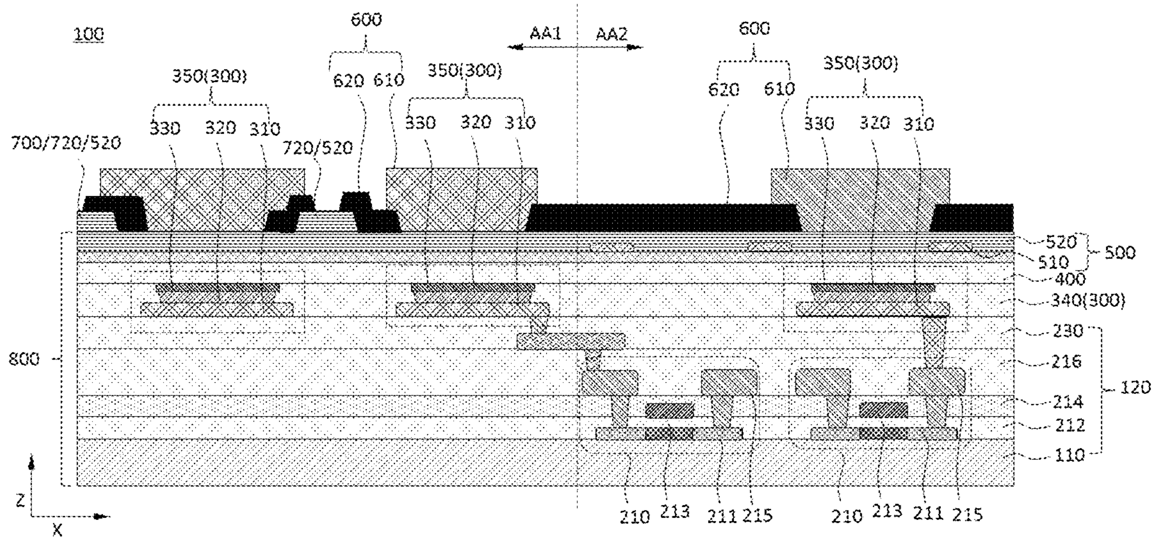
FIG. 19 is another partial cross-sectional view taken along line A-A in FIG. 1 according to an embodiment of the present disclosure.
Figure 20:
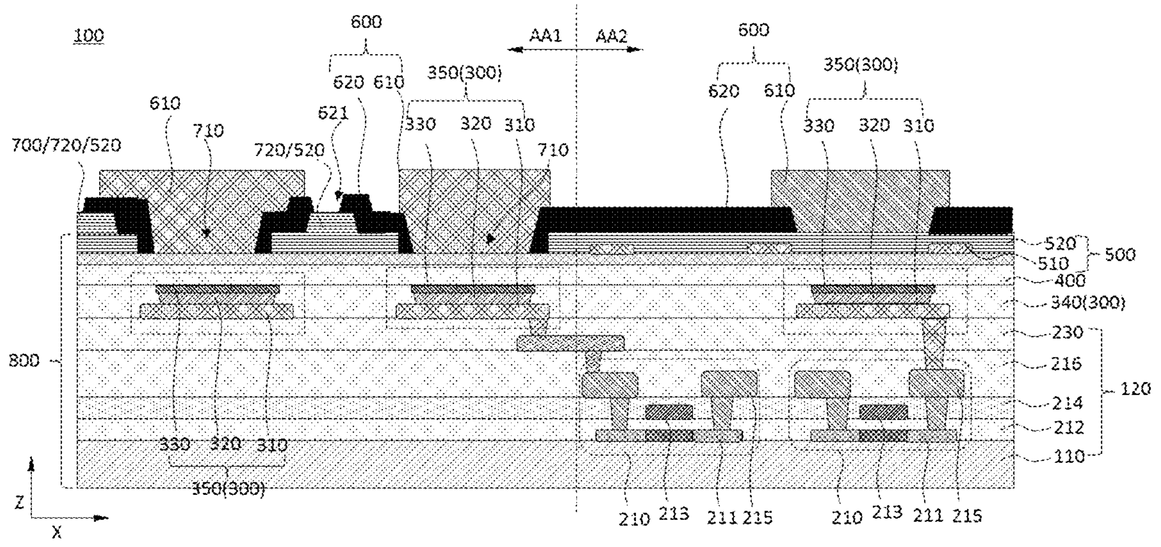
FIG. 20 is another partial cross-sectional view taken along line A-A in FIG. 1 according to an embodiment of the present disclosure.

FIG. 18 is another partial cross-sectional view taken along line A-A in FIG. 1. FIG. 19 is another partial cross-sectional view taken along line A-A in FIG. 1. FIG. 20 is another partial cross-sectional view taken along line A-A in FIG. 1. The sectional plane is perpendicular to the plane of the display panel. In some embodiments, as shown in FIG. 18 to FIG. 20, the overlapping region of the auxiliary structure 700 and the color resist 610 is provided with a second opening 710, and/or, a pad is provided in a region where the auxiliary structure 700 does not overlap with the color resist 610.

In some embodiments, as shown in FIG. 18, the overlapping region of the auxiliary structure 700 and the color resist 610 is provided with a second opening 710.

In some embodiments, the second opening 710 is located in the first display region AA1.

In some embodiments, the light-blocking layer 620 covers the side wall of the second opening 710.

In some embodiments, the second opening 710 is a recess or a hollow. It should be noted that the recess may be a non-penetrating recess opened on the side of the auxiliary structure 700 away from the substrate 100, and the hollow may be a through hole penetrating through the auxiliary structure 700 along the direction Z perpendicular to the plane of the display panel 100.

That means at least a part of the auxiliary structure 700 overlapping with the color resist has a thickness less than at least a part of the auxiliary structure 700 not overlapping with the color resist. It should be noted that when the second opening is a hollow, the thickness of the part of the auxiliary structure 700 overlapping with the color resist may be 0.

In this embodiment, when forming the color resist, the second opening 710 formed in the auxiliary structure 700 can store more color resist material in the location where the color resist needs to be kept, thereby reducing the thickness difference between the color resist in the CUP region and the color resist in the non-CUP region.

In some embodiments, the normal display region (i.e., the non-CUP region, for example, the second display region AA2 and the third display region AA3) is not provided with the light-transmitting auxiliary structure, or the light-transmitting auxiliary structure is arranged in the entire plane. In some embodiments, the entire-plane auxiliary structure in the normal display region does not include the second opening.

In some embodiments, the auxiliary structure is reused as the insulation layer of the touch function layer, which will be described in detail hereinafter.

In some embodiments, as shown in FIG. 19, the non-overlapping region of the auxiliary structure 700 and the color resist 610 is provided with a pad 720.

In some embodiments, the pad 720 is arranged in the first display region AA1.

In some embodiments, the pad 720 is a convex structure protruding towards the color filter layer 600.

In some embodiments, the projection of the pad 720 along the direction Z is located between two adjacent light-emitting elements 350 in the first display region AA1, or located between two adjacent color resists 610 in the first display region AA1.

In some embodiments, the pad 720 is provided corresponding to the light-transmitting region SS, and may be an island structure disposed in the mesh hole of the light-blocking layer 620. Of course, in some embodiments, each light-transmitting region may include multiple sub-pads according to needs, which is not described in details here.

In some embodiments, the light-blocking layer 620 covers the side wall of the pad 720.

In some embodiments, the normal display region (i.e., the non-CUP region, for example, the second display region AA2 and the third display region AA3) is not provided with the light-transmitting auxiliary structure, or the light-transmitting auxiliary structure is arranged in the entire plane. In some embodiments, the entire-plane auxiliary structure in the normal display region does not include the pad.

In some embodiments, the pad is reused as the insulation layer of the touch function layer, which will be described in detail hereinafter.

In this embodiment, when forming the color resist, the pad 720 formed in the auxiliary structure 700 can replace the light-blocking layer that has been removed from the light-transmitting region, and can form a structure similar to a barrier wall or a dam and store more color resist material in the location where the color resist needs to be kept, thereby reducing the thickness difference between the color resist in the non-CUP region and the color resist in the CUP region.

In some embodiments, as shown in FIG. 20, the auxiliary structure 700 may include both the second opening 710 and the pad 720.

In some embodiments, the light-blocking layer 620 covers the side wall of the pad 720.

In some embodiments, the light-blocking layer 620 covers the side wall of the second opening 710.

In this embodiment, for the descriptions of the second opening 710 and the pad 720, reference can be made to the above embodiments, which are not repeated here.

As shown in FIG. 17 to FIG. 20, the display panel further includes a touch function layer 500, and the auxiliary structure is reused as a sub-layer in the touch function layer.

In some embodiments, the touch function layer is located between the color filter layer and the display function layer.

In some embodiments, the touch function layer 500 is located on the encapsulation layer 400 of the display panel 100. That means, the touch function layer is located on the side of the encapsulation layer 400 away from the light-emitting elements.

In some embodiments, the auxiliary structure 700 is reused as a sub-layer in the touch function layer 500. That means, the auxiliary structure 700 is located in the same layer and made of the same material as one or more layers in the touch function layer 500.

In addition to improving the display effect, the above configuration has the following effects. On the one hand, the manufacturing process is simplified, and the thickness of the layer is reduced. On the other hand, the touch structure is retained in the CUP region. In this regard, the stacking structure in the CUP region is more similar to the stacking structure in the non-CUP region, thereby improving the structure uniformity of the layer (for example, the color resist) formed subsequently.

In some embodiments, the touch function layer 500 includes at least one insulation layer 520, and the insulation layer 520 is reused as the auxiliary structure 700.

In some embodiments, the insulation layer is made of an optically clear adhesive (OCA), or a touch panel over coating (TPOC) is reused as the insulation layer.

Specifically, when the display panel includes the touch function layer, insulation layers are provided for separating the touch function layer and other function layers, and/or separating different conductive layers 510 (for example, the touch electrode and the connection bridge) in the touch function layer. In this disclosure, these insulation layers are referred to as touch insulation layers. In embodiments of the present disclosure, the touch insulation layers in the first display region AA1 are retained, and are reused as the auxiliary structure where the hollow or the recess is provided for forming the second opening. In one aspect, the process of removing the touch insulation layer in the first display region AA1 is no longer needed. In another aspect, an additional auxiliary layer is avoided, and thus the thickness of the display panel is not increased. In yet another aspect, since the display panel includes at least two touch insulation layers, different second openings for accommodating different color resists may have different depths by selecting the number of the touch insulation layers penetrated by the second openings. It should be noted that the insulation layer on the conductive layer 510 is reused as the auxiliary structure in this embodiment, while in other embodiments of the present disclosure, the second opening may be formed in both the insulations layers on and below the conductive layer 510.

In some embodiments, the color filter layer 600 further includes a light-blocking layer 620 arranged in the periphery of the color resist 610. The light-blocking layer 620 includes a first opening 621 exposing the light-transmitting region.

For the arrangement of the first opening 621, reference can be made to the above embodiments, which is not repeated here.

In some embodiments, the size of the second opening 710 is the same as the size of the first opening 621.

In some embodiments, the volume of the second opening 710 is the same as the volume of the first opening 621. That means, the capacity of the second opening 710 is the same as the capacity of the first opening 621.

In some embodiments, the area of the first opening 621 is the same as the area of the second opening 710.

With the above configuration, the amount of the color resist material accommodated in the second opening for compensation is as much as possible equal to the amount of the color resist material lacked in the light-transmitting region due to the first opening formed in the light-blocking layer, thereby further improving the compensation effect of the auxiliary structure.

In some embodiments, the size of the pad 720 is the same as the size of the first opening 621.

In some embodiments, the volume of the pad 720 is the same as the volume of the first opening 621. It means that the volume of the pad 720 is the same as the capacity of the first opening 621.

In some embodiments, the area of the first opening 621 is the same as the area of the pad 720.

With such configuration, the compensation amount by the pad on the removed light-blocking layer is as much as possible equal to the removed amount of the light-blocking layer in the first opening, which further improves the compensation effect of the auxiliary structure.

It should be noted that in the above two embodiments the "area" refers to the area of the orthographic projection of this structure one the plane of the display panel.

In some embodiments, the depth h of the first opening 621 satisfies h=h(BM)*x %, where h(BM) is the thickness of the light-blocking layer, x is the proportion of the patterns to the light-blocking layer, that is, the area proportion of the light-transmitting region SS to the light-blocking layer. For example, the thickness of the light-blocking layer is 1 μm, and the proportion of the patterns to the light-blocking layer is 40%, and then the thickness h is about 0.4 μm.

In some embodiments, with the volume of the removed light-blocking layer being compensated by the auxiliary structure in the first display region AA1, the volume of the auxiliary structure and the light-blocking layer in unit area in the first display region AA1 is equal to the volume of the auxiliary structure and the light-blocking layer in unit area in the second display region AA2 (if the second display region is also provided with the auxiliary structure layer, for example, the insulation layer in the touch layer). The principle and the effect will be described in detail hereinafter.

As shown in any one of FIG. 3, FIG. 8, FIG. 9, FIG. 12 to FIG. 14, and FIG. 16 to FIG. 20, in some embodiments, at least a part of the color resist 610 and at least a part of the light-blocking layer 620 are located in the second opening 710, and the light-blocking layer 620 covers the side wall of the second opening.

It means that the light-blocking layer 620 covers the auxiliary structure 700 so as to form the edge of the second opening 710. That means, the light-blocking layer 620 is located between the color resist 610 and the side wall of the second opening 710, and the light-blocking layer 620 at least coats the side wall of the second opening.

In some embodiments, the light-blocking layer 620 extends from the top of the second opening 710 to the bottom of the second opening 710, such that the light-blocking layer 620 completely encapsulates the side wall of the second opening 710.

In this embodiment, in addition to reducing the difference between color resists in different display regions and thus improving the display effect like the above embodiments, the blocking area of the light-blocking layer along the vertical direction, that is the direction Z perpendicular to the plane of the display panel, is increased. In other words, along the first direction X, the overlapping area of the color resist and the light-blocking layer is increased, which further reduces the reflection and solves the reflection problem when viewed form a large viewing angle.

In some embodiments, as shown in figures, the display panel 100 further includes a second display region AA2, and a light transmittance of the second display region AA2 is less than that of the first display region AA1.

In some embodiments, a pixel circuit and a thin film transistor (TFT) corresponding to a pixel in the first display region AA1 are not arranged in the first display region. For example, the pixel circuit and the TFT corresponding to the pixel in the first display region AA1 is arranged in the second display region AA2.

In some embodiments, in the second display region AA2, the light-blocking layer 620 covers the gap region between adjacent light-emitting elements 350. It means that the first opening is not provided in the light-blocking layer in the non-CUP region.

In some embodiments, as shown in FIG. 1, the display region AA of the display panel further includes a third display region AA3. The third display region AA3 surrounds or partially surrounds the second display region AA2. For example, the third display region AA3 is located between the second display region AA2 and a non-display region NA.

The second display region AA2 is a transition display region between the normal display region and the transparent display region (or the CUP region). In some embodiments, a pixel circuit corresponding to a light-emitting element in the third display region AA3 is located in the display region where this pixel SP is located. A pixel circuit corresponding to a light-emitting element in the second display region AA2 is located in the display region where this pixel SP is located, while the pixel circuit corresponding to the light-emitting element in the first display region AA1 is located in the second display region AA2. It means that both the pixel circuit for driving the light-emitting element in the second display region AA2 and the pixel circuit for driving the light-emitting element in the first display region AA1 are located in the second display region AA2.

In some embodiments, the normal display region (i.e., the non-CUP region, for example, the second display region AA2 and the third display region AA3) is not provided with the light-transmitting auxiliary structure, or is provided with a light-transmitting auxiliary structure covering an entire plane of the normal display region. In some embodiments, the auxiliary structure covering an entire plane of the normal display region includes neither the second opening nor the pad.

In some embodiments, the size of the pixel in the first display region AA1 is the same as the size of the pixel in the second display region AA2.

In some embodiments, the size of the pixel in the first display region AA1 and the size of the pixel in the second display region AA2 are both less than the size of the pixel in the third display region AA3. In this way, with ensuring the light transmittance of the first display region, both the electrical performance and the driving performance are ensured. Since the first display region and the second display region are driven be same driving units, the first display region and the second display region may employ a same gamma setting.

In some embodiments, with the volume of the removed light-blocking layer being compensated by the auxiliary structure in the first display region AA1, the volume of the auxiliary structure and the light-blocking layer in unit area in the first display region AA1 is equal to the volume of the auxiliary structure and the light-blocking layer in unit area in the second display region AA2 (if the second display region is also provided with the auxiliary structure layer, for example, the insulation layer in the touch layer). The principle and the effect will be described in detail hereinafter.

In this embodiment, in addition to the above improvement, both the light transmittance requirement and the driving design of the driving unit are satisfied, thereby improving the display effect of the display panel and simplifying the display panel.

Figure 21:
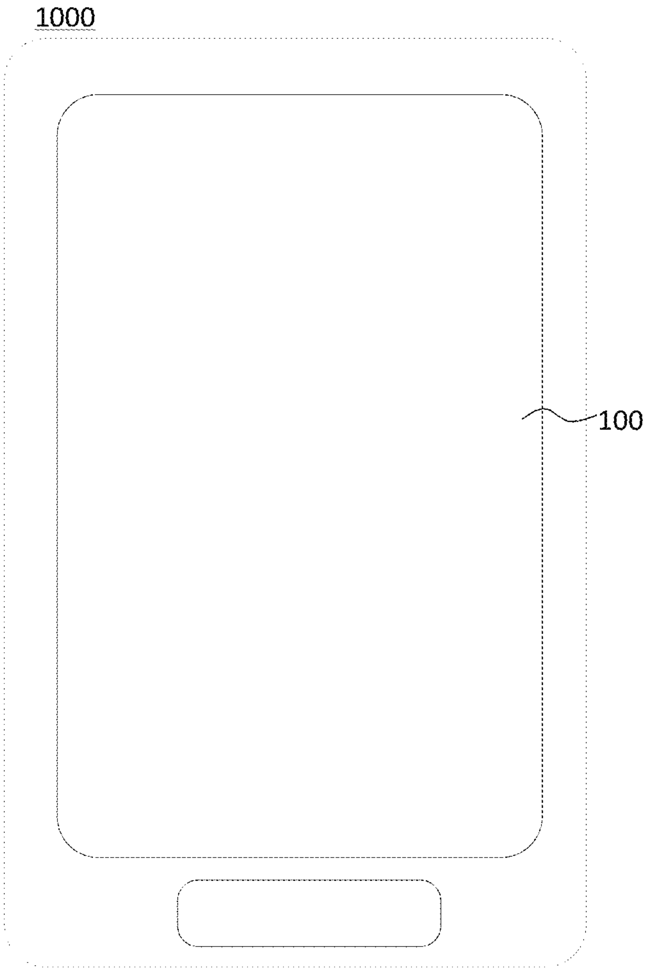
FIG. 21 is a schematic view of a display device according to embodiments of the present disclosure.

The present disclosure also provides a display device, including the display panel provided by the present disclosure. As shown in FIG. 21, FIG. 21 illustrates a schematic of a display device according to various embodiments of the present disclosure. A display device 1000 may include the display panel 100 provided by any one of the above-mentioned embodiments of the present disclosure. The embodiment of FIG. 21 may only use a mobile phone as an example to illustrate the display device 1000. It can be understood that the display device provided in various embodiments of the present disclosure may be a computer, a television, a vehicle-mounted display device, and other display device with a display function, which may not be limited according to various embodiments of the present disclosure. The display device provided by various embodiments of the present disclosure may have the beneficial effects of the display panel provided by various embodiments of the present disclosure. Details may refer to the description of the display panel in the above-mentioned embodiments, which may not be described in detail herein.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A display panel having a first display region comprising a light-transmitting region, and the display panel comprising:

a display function layer comprising light-emitting elements;

a color filter layer arranged on a side of the display function layer facing towards a display surface of the display panel, and comprising color resists corresponding to the light-emitting elements; and auxiliary structures that are nonopaque and arranged on the side of the display function layer facing towards the display surface of the display panel, wherein each of the auxiliary structures is at least located between adjacent color resists of the color resists and overlaps with the light-transmitting region;

wherein the color filter layer further comprises a light-blocking layer disposed around color filters, and one of the auxiliary structures overlaps with an edge of the light-blocking layer or is at least partially located on a side of the light-blocking layer facing away from the display surface of the display panel; or wherein the light-blocking layer comprises a first opening exposing the light-transmitting region, at least a part of one of the auxiliary structures being located in the first opening.

2. The display panel according to claim 1, wherein one of the auxiliary structures overlaps with one of color filters along a first direction, wherein the first direction is parallel to a plane of the display panel.

3. The display panel according to claim 1, wherein a top surface of one auxiliary structure of the auxiliary structures is flush with a top surface of the light-blocking layer, or a segment difference between the top surface of the auxiliary structure and the top surface of the light-blocking layer is less than or equal to 0.5 μm.

4. The display panel according to claim 1, wherein a thickness of a part of the light-blocking layer close to one auxiliary structure of the auxiliary structures is greater than a thickness of another part of the light-blocking layer facing away from the auxiliary structure.

5. The display panel according to claim 1, wherein one of the auxiliary structures overlaps with the light-blocking layer along the first direction that is parallel to a plane of the display panel.

6. The display panel according to claim 1, wherein along a direction from a center of the first display region to an edge of the first display region, the auxiliary structures overlap with the light-blocking layer with decreasing sizes.

7. The display panel according to claim 1, wherein one of the auxiliary structures is at least partially located on a side of the light-blocking layer facing towards the display surface of the display panel.

8. The display panel according to claim 1, wherein one of the auxiliary structures at least partially overlaps with one of the color resists.

9. The display panel according to claim 1, wherein the light-blocking layer at least partially overlaps with one of the color resists, and different color resists of the color resists overlap with the light-blocking layer by different sizes, or wherein one of the auxiliary structures at least partially overlaps with one of the color resists, and different color resists of the color resists overlap with one of the auxiliary structures by different sizes.

10. The display panel according to claim 1, further comprising:

a touch function layer located at the side of the display function layer facing towards the display surface of the display panel, wherein a sub-layer of the touch function layer is reused as the auxiliary structures.

11. The display panel according to claim 1, further having a second display region having a smaller light transmittance than the first display region, wherein, in the second display region, the light-blocking layer covers a gap region between adjacent light-emitting elements of the light-emitting elements.

12. A display device comprising a display panel, wherein the display panel has a first display region comprising a light-transmitting region, and comprises:

a display function layer comprising light-emitting elements;

a color filter layer arranged on a side of the display function layer facing towards a display surface of the display panel, and comprising color resists corresponding to the light-emitting elements; and auxiliary structures that are nonopaque and arranged on the side of the display function layer facing towards the display surface of the display panel, wherein each of the auxiliary structures is at least located between adjacent color resists of the color resists and overlaps with the light-transmitting region;

wherein the color filter layer further comprises a light-blocking layer disposed around color filters, and one of the auxiliary structures overlaps with an edge of the light-blocking layer or is at least partially located on a side of the light-blocking layer facing away from the display surface of the display panel; or wherein the light-blocking layer comprises a first opening exposing the light-transmitting region, at least a part of one of the auxiliary structures being located in the first opening.

13. A display panel having a first display region comprising a light-transmitting region, and the display panel comprising:

a display function layer comprising light-emitting elements;

a color filter layer arranged on a side of the display function layer facing towards a display surface of the display panel, and comprising color resists corresponding to the light-emitting elements; and auxiliary structures that are nonopaque and arranged on the side of the display function layer facing towards the display surface of the display panel, wherein each of the auxiliary structures is at least located between adjacent color resists of the color resists and overlaps with the light-transmitting region;

wherein one of the auxiliary structures comprises a second opening overlapping with the color resists.

14. The display panel according to claim 13, wherein the color filter layer further comprises a light-blocking layer disposed around the color filters, at least one color resist of the color resists and at least part of the light-blocking layer are located in the second opening, and the light-blocking layer covers a side wall of the second opening.

15. The display panel according to claim 13, wherein the color filter layer further comprises a light-blocking layer disposed around the color resists, wherein the light-blocking layer comprises a first opening exposing the light-transmitting region, and wherein the second opening or the pad has a same size as the first opening.

16. A display panel having a first display region comprising a light-transmitting region, and the display panel comprising:

a display function layer comprising light-emitting elements;

a color filter layer arranged on a side of the display function layer facing towards a display surface of the display panel, and comprising color resists corresponding to the light-emitting elements; and auxiliary structures that are nonopaque and arranged on the side of the display function layer facing towards the display surface of the display panel, wherein each of the auxiliary structures is at least located between adjacent color resists of the color resists and overlaps with the light-transmitting region;

wherein a pad is provided in a region where one of the auxiliary structures does not overlap with one of the color resists.

* * * * *